United States Patent
Meyer et al.

(10) Patent No.: US 10,549,405 B2
(45) Date of Patent: Feb. 4, 2020

(54) VACUUM GRIPPING DEVICE AND METHOD FOR OPERATING A VACUUM GRIPPING DEVICE

(71) Applicant: FESTO AG & Co. KG, Esslingen (DE)

(72) Inventors: Manuel Meyer, Donaueschingen (DE); Jens Anderle, Deggingen (DE); Hannes Wirtl, Schongau (DE)

(73) Assignee: FESTO AG & Co. KG, Esslingen (DE)

( * ) Notice: Subject to any disclaimer, the term of this patent is extended or adjusted under 35 U.S.C. 154(b) by 215 days.

(21) Appl. No.: 15/741,442

(22) PCT Filed: Jul. 13, 2015

(86) PCT No.: PCT/EP2015/065975
§ 371 (c)(1),
(2) Date: Jan. 2, 2018

(87) PCT Pub. No.: WO2017/008837
PCT Pub. Date: Jan. 19, 2017

(65) Prior Publication Data
US 2018/0369996 A1 Dec. 27, 2018

(51) Int. Cl.
*B25B 11/00* (2006.01)
(52) U.S. Cl.
CPC ................. *B25B 11/005* (2013.01)
(58) Field of Classification Search
CPC . B25B 11/005; B25J 15/0009; B25J 15/0023; B25J 15/1612; B25J 15/0625
USPC ............................ 294/185, 186, 188; 269/21
See application file for complete search history.

(56) References Cited

U.S. PATENT DOCUMENTS

| | | | | |
|---|---|---|---|---|
| 5,183,670 A | * | 2/1993 | Trudeau | H05K 13/0409 425/126.1 |
| 2003/0220059 A1 | * | 11/2003 | Yamasaki | B25B 11/005 451/388 |
| 2008/0150207 A1 | * | 6/2008 | Fukano | B25B 11/005 269/21 |
| 2013/0277999 A1 | * | 10/2013 | Schaller | H01L 21/6838 294/186 |

FOREIGN PATENT DOCUMENTS

| CN | 101320275 A | 12/2008 |
|---|---|---|
| CN | 104114878 A | 10/2014 |
| DE | 102006027303 | 12/2007 |

(Continued)

*Primary Examiner* — Paul T Chin
(74) *Attorney, Agent, or Firm* — Hoffman & Baron, LLP

(57) ABSTRACT

A method for operating a vacuum gripping device including a suction gripper unit, which is provided with at least one suction gripper. The suction gripper unit can be connected, via a control valve device connected to it, selectively to a vacuum source or to a positive pressure source generating an ejector pulse in the suction gripper. The ejector pulse is generated as a function of the actual pressure established in the suction gripper unit after its connection to the positive pressure source. A vacuum gripping device suitable for executing this method and including a pressure measurement device for detecting the actual pressure and an electronic control unit used for controlling the control valve device and communicating with the pressure measurement device.

16 Claims, 3 Drawing Sheets

(56) References Cited

FOREIGN PATENT DOCUMENTS

| | | |
|---|---|---|
| DE | 102007031760 | 1/2009 |
| DE | 102008005241 | 7/2009 |
| DE | 102014218295 | 4/2015 |
| WO | WO2013034635 | 3/2013 |
| WO | WO2013120802 | 8/2013 |

\* cited by examiner

# VACUUM GRIPPING DEVICE AND METHOD FOR OPERATING A VACUUM GRIPPING DEVICE This application claims priority based on an International Application filed under the Patent Cooperation Treaty, PCT/EP2015/065975, filed Jul. 13, 2015.

BACKGROUND OF THE INVENTION

The invention relates to a method for operating a vacuum gripping device comprising a suction gripper unit which is provided with at least one suction gripper and which can selectively be connected, via a control valve device connected to it, to a vacuum source causing a negative pressure in the suction gripper or to a positive pressure source generating an ejector pulse in the suction gripper.

The invention further relates to a vacuum gripping device which can in particular be operated as described above and which comprises a suction gripper unit which is provided with at least one suction gripper and which can selectively be connected, via a control valve device connected to it, to a vacuum source causing a negative pressure in the suction gripper or to a positive pressure source generating an ejector pulse in the suction gripper, wherein an electronic control unit is provided for controlling the control valve device, and wherein at least one pressure measurement device suitable for measuring the actual pressure prevailing in the suction gripper unit and communicating with the electronic control unit is assigned to the suction gripper unit.

From DE10 2007 031 760 A1 a vacuum gripping device constructed and operable as described above is known, which makes it possible to grip via negative pressure and hold objects to be repositioned temporarily and to throw the gripped object off the suction gripper holding it by means of a positive pressure pulse described as ejector pulse after it has been conveyed to a desired location. An electrically selectable control valve device is capable of selectively connecting a suction gripper unit comprising the suction gripper and a working line establishing the connection to the suction gripper either to a vacuum source or to a positive pressure source. For control, the vacuum gripper device is provided with an electronic control unit capable of evaluating an actual pressure measured in the suction gripper unit, for example for continuously monitoring the maintenance of a desired negative pressure level, while the gripped object is being repositioned. The ejector pulse is generated by connecting the suction gripper unit by means of the control valve device to the positive pressure source at a variably adjustable flow rate, so that the time within which the vacuum is built up in the suction gripper and an ejection force of greater or lesser strength is built up can be varied. Unfortunately the required setting parameters are highly dependent on the respective marginal conditions of the system, such as the level of the nominal pressure made available by the positive pressure source or the length of a working line of the suction gripper unit between the control valve device and the suction gripper. This being so, each gripping device has to be individually adapted before the start of operations. Finding the optimum setting is always very time-consuming, in particular because the size and the weight of the objects to be gripped play an important role.

If, for example, the set pulse duration of the ejector pulse is too short and the resulting air flow rate correspondingly low, the vacuum in the suction gripper is not cancelled completely, and the object continues to adhere to the suction gripper. If the pulse duration is too long and the air flow rate to high, on the other hand, the blow-off process can have the result that the ejected object or even other objects in the area is/are blown out of the assigned repository and the objects cannot be deposited in a repeatable manner.

A comparable problem applies to the vacuum gripping device described in DE 10 2008 005 241 A1, in which the ejector pulse is generated in a purely time-controlled manner during an empirically determined, fixedly or adjustably preset time interval.

SUMMARY OF THE INVENTION

It is an object of the invention to take measures which facilitate a generation of an ejector pulse adapted to the respective object to be gripped which is at least substantially independent of the marginal conditions of the system.

To solve this object, it is provided in a method of the type referred to above that the ejector pulse is generated as a function of the actual pressure established in the suction gripper unit after its connection to the positive pressure source.

According to the invention, the problem is further solved in a vacuum gripping device of the type referred to above by providing that the electronic control unit is provided with control means by means of which the control valve device can be controlled for generating the ejector pulse as a function of the actual pressure established in the suction gripper unit after its connection to the positive pressure source.

Compared to previous methods and devices, which were time-guided or based on air flow rate, the invention evaluates the actual pressure established in the suction gripper unit connected to the positive pressure source when generating the ejector pulse, so that the system immediately receives feedback on the events on the side of the suction gripper during the build-up of the ejector pulse. On the basis of the changing actual pressure, direct conclusions can therefore be drawn regarding the quality of the object ejection process. The method and the device operate adaptively within a wide range and are capable of adapting to changing marginal conditions. This reduces the setting effort to a minimum. If small and light-weight objects such as computer chips are to be gripped and deposited, for example, the measures according to the invention can ensure that an individually adapted pulse duration provides for a safe but still gentle ejection at the delivery location.

Advantageous further pressure courses of the invention emerge from the dependent claims.

In a preferred variant of the method, the ejector pulse is formed by monitoring a pressure threshold. During the generation of the ejector pulse, an actual pressure prevailing in the suction gripper unit is measured, wherein the positive pressure source is disconnected from the suction gripper unit by means of the control valve device when the measured actual pressure has reached a preset positive pressure limit value. The positive pressure limit value is variably presettable. Expediently, a positive pressure limit value of 0.05 bar to 0.15 bar and in particular in the range of 0.1 bar is chosen. A control valve device with very short switching times is preferably used, for example a piezoelectric valve device, so that the actual pressure can develop in an almost overshoot-free manner by particularly simple means.

A further advantageous implementation of the method provides that, during the generation of the ejector pulse, an actual pressure prevailing in the suction gripper unit is measured again, wherein this actual pressure is regulated to provide a target pressure by suitable control of the control valve device accompanied by a short-time overshooting of atmospheric pressure. For the execution of this method, a proportional valve device is expediently used as control valve device; with the aid of a suitable controller, in particular a PID controller, this facilitates a targeted correction of the suction gripper-side actual pressure. The controller is in particular parameterised in such a way that a targeted and controlled overshooting into the positive pressure range is caused in the pressure course of the actual pressure, so that it can be ensured that the vacuum in the suction gripper has been reliably reduced and an object previously gripped has been released from the suction gripper. The actual pressure is preferably regulated to atmospheric pressure in the above pressure control process.

A further advantageous embodiment of the method provides that, during the generation of the ejector pulse, an actual pressure prevailing in the suction gripper unit is measured and the positive pressure source is disconnected from the working line by means of the control valve device as soon as a pressure drop is detected during the measurement of the actual pressure.

Measurements have shown that in the pressure course of the actual pressure during the usual generation of the ejector pulse, there is a short but noticeable pressure drop related to the release of the previously gripped object from the suction gripper. The preferred method evaluates the pressure course of the actual pressure and terminates the application of positive pressure to the suction gripper unit if the pressure drop characteristic for the ejection process is detected when measuring the actual pressure.

The pressure drop can be detected very precisely by determining the negative gradient, which first occurs at the pressure increase, by means of a differentiation of the pressure signal in an electronic control unit designed for this purpose.

The method based on the detection of the pressure drop also offers the advantageous possibility of using the detection of the pressure drop for generating an ejection confirmation signal. This signal, which confirms the ejection of the object, can advantageously be used as a basis for subsequent processes in an electronic control unit.

The suction gripper unit expediently comprises a working line connected to the at least one suction gripper to establish the connection between the suction gripper and the control valve device. This working line can be a passage formed in a rigid body or is preferably formed by a flexible hose line which can easily be routed as required.

The actual pressure is preferably measured in the region of the suction gripper, with the transitional region between the working line and the suction gripper being particularly suitable. In this region, a suitable pressure measurement device such as a pressure sensor can be installed very easily.

An alternative option provides for measuring the actual pressure in the transitional region between the control valve device and the working line. In view of the greater distance between the pressure measuring zone and the suction gripper, a certain inertia of the system has to be taken into account in this arrangement.

There is also the advantageous option to measure the actual pressure simultaneously at several spaced points of the suction gripper unit and to process the actual pressure values as mean values or with suitable weighting.

For the pressure-controlled operating method, the use of a proportional valve device as control valve device is recommended, in particular in a piezoelectric valve design. In principle, however, a proportional valve device can be used for the other implementations of the method according to the invention as well. As an alternative to a proportional valve device, the switching valve device can be digitally switchable and in particular comprise two control valves of which one is responsible for the connection between the suction gripper unit and the positive pressure source and the other is responsible for controlling the connection between the suction gripper unit and the vacuum source. These control valves are designed as 2/2-way switching valves in particular. For a quasi-control, the control valves designed as switching valves can also be used with pulse width modulation.

BRIEF DESCRIPTION OF THE DRAWINGS

The invention is explained in greater detail below with reference to the enclosed drawing, of which.

DETAILED DESCRIPTION OF THE PREFERRED EMBODIMENTS

Figure 2:
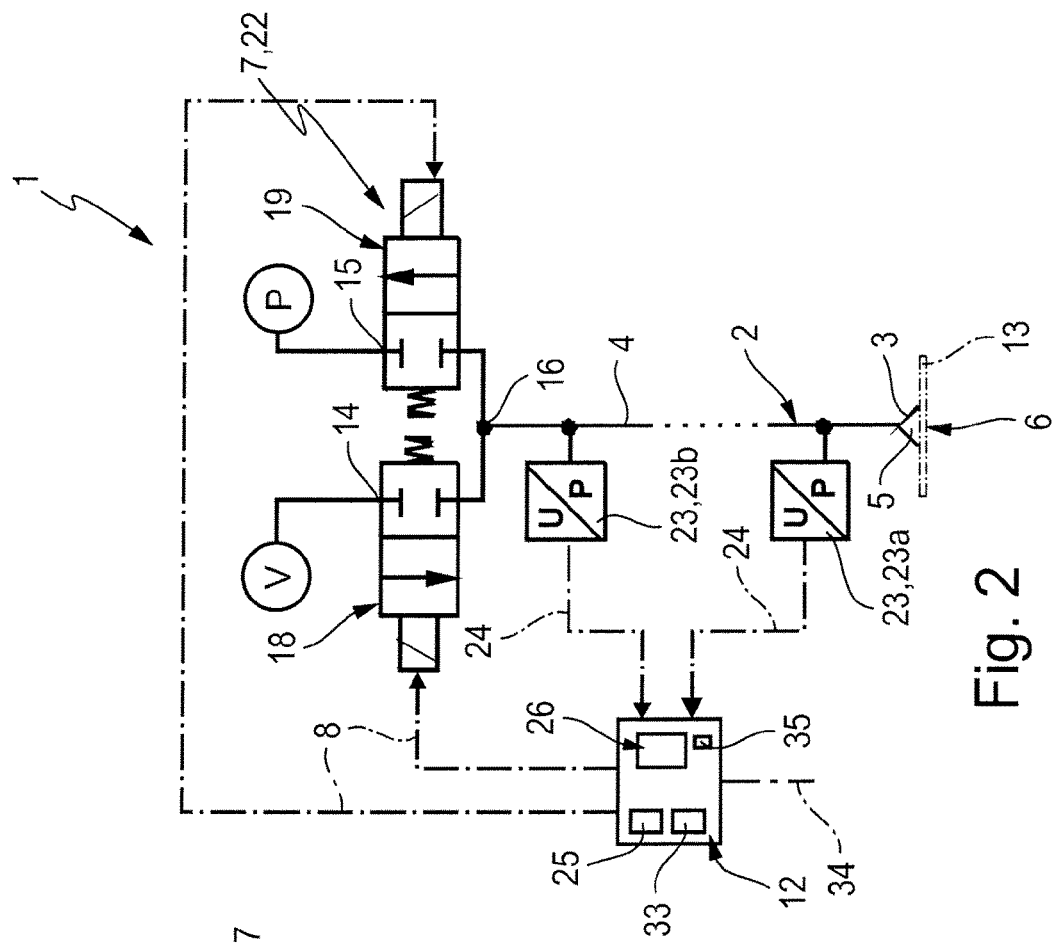
FIG. 2 is the circuit diagram of an alternative embodiment of the vacuum gripping device according to the invention, its control valve device consisting of two digitally switchable control valves.
Figure 1:
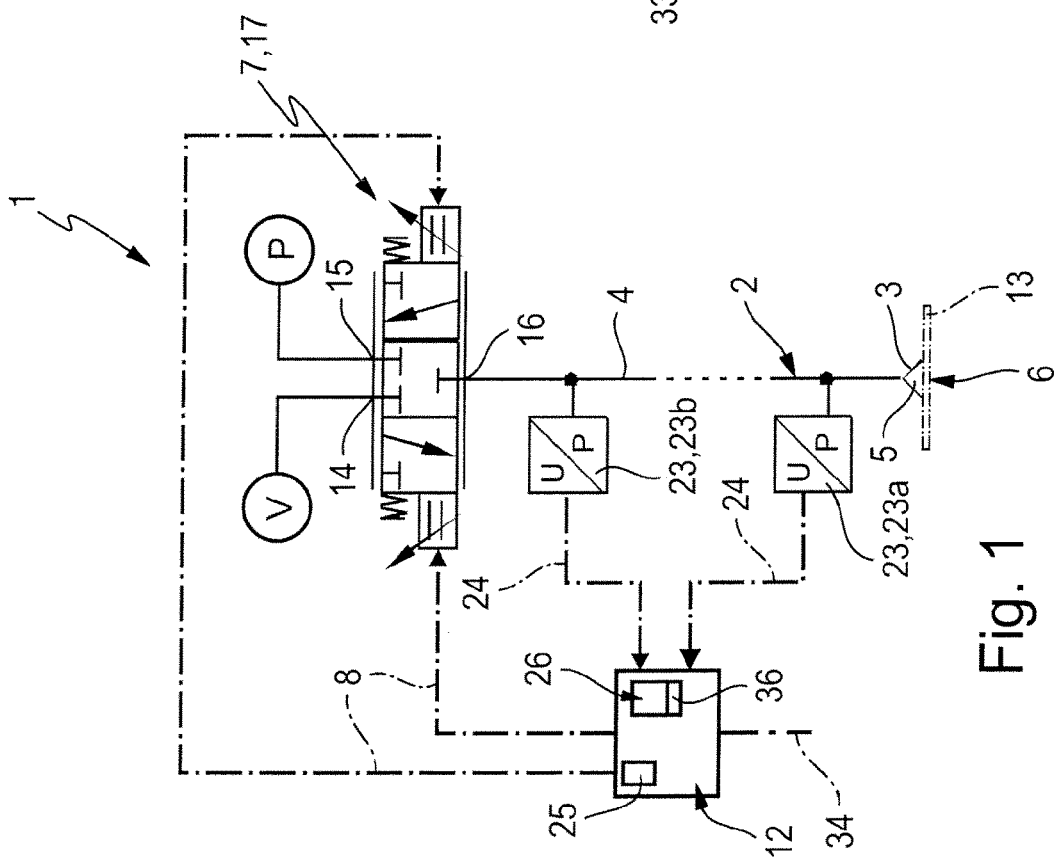
FIG. 1 is the circuit diagram of a preferred embodiment of the vacuum gripping device according to the invention, its control valve device being represented by a proportional valve device.

The two vacuum gripping devices 1 shown in FIGS. 1 and 2 both comprise a suction gripper unit 2 containing at least one suction gripper 3 and a working line 4 connected to the suction gripper 3 and suitable for carrying air.

The suction gripper 3, e.g. a suction cup or suction disc, bounds a suction chamber 5, which is normally open on a working side 6 of the suction gripper 3 and in fluid connection to a passage extending through the working line 4.

The working line 4 may, for example, be a rigid pipe or an air duct formed in a rigid body of any type. Particularly advantageous is a design as a flexible hose line, because this allows for very variable routing. A typical length of the working line is between 0.03 and 1.5 m. Depending on application, the working line 4 may even be omitted completely.

A control valve device 7 of the vacuum gripping device 1 is connected to the suction gripper unit 2. In this way, the suction gripper 3 or, more precisely, its suction chamber 5 is in fluid connection to the control valve device 7. If the suction gripper unit 2, as in the illustrated embodiment, comprises a working line 4, the control valve device 7 is expediently connected to that end section of the working line 4 which is opposite the suction gripper 3.

In an embodiment not shown in the drawing, the suction gripper 3 is directly mounted on the control valve device 7 without the additional working line 4.

The control valve device 7 can be controlled electrically for setting its operating state. The control signals required for this are received by the control valve device 7 via one or more control lines indicated by dot-dash lines from an electronic control unit 12, which is preferably also a part of the vacuum gripping device 1. In place of the control lines 8, means for wireless signal transmission between the electronic control unit 12 and the control valve device 7 can be provided.

The electronic control unit 12 can be designed for autonomous operation. Preferably, however, it is provided with communication means facilitating a communication with a higher-order electronic control device which, in addition to the vacuum gripping device 1, controls further vacuum gripping devices 1 and/or other components of a system or machine.

The output side of the suction gripper unit 2 is connected to the control valve device 7. On the input side, the control valve device 7 is independently connected to a positive pressure source P and a negative pressure or vacuum source V. The positive pressure source P can be placed at any distance from the control valve device 7 and provides compressed air under positive pressure, its level to be described as nominal positive pressure. The positive pressure source P preferably comprises a compressed air reservoir and at least one compressor for generating the compressed air.

The vacuum source V provides a negative pressure, i.e. a pressure below atmospheric pressure. The vacuum source V is, for example, a vacuum pump or an ejector device with at least one suction nozzle operating in accordance with the ejector principle. In such an ejector device, an inlet of the suction nozzle is usually connected to a source of compressed air, while an outlet of the suction nozzle leads to the atmosphere. The suction nozzle furthermore has a suction side where a negative pressure is generated if the compressed air flows through the suction nozzle, its inlet side being connected to the control valve device 7 for the provision of the negative pressure.

With the vacuum gripping device 1, objects 13, one of which is shown as a plate-shaped object in the drawing, can be picked up by means of negative pressure and held for any length of time. The suction gripper 3 is preferably movable, so that the gripped object 13 can be repositioned by its movement. At a delivery location, which as a rule does not coincide with the pickup location of the object 13, the gripped object 13 can then be deposited. In this context, we can speak of a pick-and-place application. For the above-mentioned movement of the suction gripper 3, the vacuum gripping device 1 is usually provided with suitable positioning means, such as a multiaxial positioning system. The positioning means can alternatively be designed such that not only the suction gripper 3, but the entire suction gripper unit 2 and in some circumstances even the control valve device 7 join(s) the positioning movement.

The control valve device 7 can be controlled in such a way that it selectively adopts a positive pressure operating state or a negative pressure operating state. In the positive pressure operating state, it connects the suction gripper unit 2 and thus the suction chamber 5 of the suction gripper 3 to the positive pressure source P, and in the negative pressure operating state, it connects it to the vacuum source V. In this way, a positive pressure or a negative pressure can selectively be applied to the suction gripper 3 or its suction chamber 5.

In order to grip an object 13, the suction gripper 3 is positioned at the object 13 with its initially still open working side 6 leading. In this process, the open working side 6 of the suction chamber 5 is closed by the object 13. After this positioning of the suction gripper 3 at the object 13, or even shortly before, the control valve device 7 is switched into the negative pressure operating state, so that the interior of the suction gripper unit 2, i.e. the suction chamber 5 and the internal passage of the optional working line 4 communicating therewith, is evacuated. The pressure differential applied thereby to the object 13 ensures that the object 13 is sucked onto and held on the suction gripper 3.

In order to deposit the gripped object 13 at the desired location, the control valve device 7 is switched into the positive pressure operating state for a short time. This results in a positive pressure pulse in the suction gripper unit 2 and thus in the suction chamber 5; this is described as an ejector pulse, because it causes the active ejection of the object 13 from the suction gripper 3. This facilitates a clearly defined and in particular a fast placing of the object 13 at the delivery location.

The control valve device 7 can preferably also adopt a shut-off operating state in which the suction gripper unit 2 is disconnected from both the positive pressure source P and the vacuum source V. To obtain an energy saving effect, the control valve device 7 is preferably designed such that, while an object 13 is held, it can be switched between the negative pressure operating state and the shut-off operating state, so that the vacuum source V does not apply a vacuum to the suction gripper unit 2 continuously.

The control valve device 7 expediently has a 3/3-way valve functionality as a whole. In other words: it has three ports—two input ports 14, 15, of which one is connected to the positive pressure source P and the other is connected to the vacuum source V, and an output port 16 connected to the suction gripper unit 2—and can be placed in the three operating states mentioned above.

The control valve device 7 can be a single valve or composed of a functionally inter-connected valve assembly. The embodiment of FIG. 1 shows a control valve device 7 represented by a single valve, which is preferably a proportional valve device 17. In the embodiment of FIG. 2, the control valve device 7 is composed of two individual control valves 18, 19, one of which controls the connection to the positive pressure source P and the other of which controls the connection to the vacuum source V. These two control valves 18, 19 expediently are 2/2-way valves. These two control valves 18, 19 are preferably designed as digitally switchable switching valves. The control valve device 7 of the embodiment of FIG. 2 therefore represents a digitally switchable switching valve device 22.

A design of the control valve device 7 as a proportional valve device 17 facilitates the variable and in particular continuously variable presetting of the air flow rate both during the positive pressure operating state and during the negative pressure operating state. In a switching valve device 22, on the other hand, the maximum flow cross-section is available both in the positive pressure operating state and in the negative pressure operating state.

The control valve device 7 is preferably designed as a piezoelectric valve device. This in particular applies to the proportional valve device 17, but preferably to the switching valve device 22 as well. Piezoelectric valves feature very short switching times, which reduces the overshooting propensity when cancelling the positive pressure. The proportional valve behaviour in particular offers the advantageous option of pressure control.

The vacuum gripping device 1 is further provided with at least one pressure measurement device 23, which is capable of measuring the current pressure in the suction gripper unit 2, which is hereinafter described as actual pressure. The pressure is preferably measured in the region of the suction gripper 3 and/or in the region of the control valve device 7. According to an advantageous equipment variant, the illustrated embodiments are provided with two pressure measurement devices 23, wherein a first (23a) of the pressure measurement devices 23 is installed for action in the transitional region between the working line 4 and the suction gripper 3 and a second (23b) of the pressure measurement devices 23 is installed for action in the transitional region between the control valve device 7 and the working line 4. In this way, the actual pressure in the interior of the suction gripper unit 2 can be measured both in the region of the suction gripper 3 and thus in the immediate vicinity of the suction chamber 5 and in the region of the output port 16 of the control valve device 7.

In the operation of the vacuum gripping device 1, both pressure measurement devices 23 can be used in parallel to detect the actual pressure in the suction gripper unit 2. In this process, the pressure measuring process is, in terms of the events immediately acting on the suction chamber 5, slightly more sluggish at the second pressure measurement device 23b, which is located farther away from the suction chamber 5, than at the first pressure measurement device 23a.

The pressure measurement devices 23 are connected to the electronic control unit 12 via signal lines 24 or in a wireless arrangement and provide it with a voltage signal representing the measured actual pressure for further evaluation and/or processing.

The control unit 12 can be provided with means for processing the pressure values measured by the two pressure measurement devices 23a, 23b in an interlinked manner, e.g. by averaging or a combination of matched weighting. The control unit 12 preferably also offers the option of processing only the measured values of one of the two pressure measurement devices 23a, 23b in the operation of the vacuum gripping device 1, the control unit 12 being expediently provided with selection means 25 for the individual selection and presetting of the pressure measurement device 23a, 23b to be used for current operation.

According to an embodiment not shown in the drawing, the vacuum gripping device 1 can also be provided with only one pressure measurement device 23 for detecting the actual pressure; this is then connected for action to the interior of the suction gripper unit 2, to which the air is applied, either in the region of the suction gripper 3 or in the region of the control valve device 7.

The electronic control unit 12 is preferably provided with electronic control means 26 designed to control the control valve device 7 for the generation of the ejector pulse as a function of the actual pressure established in the suction gripper unit 2 after its connection to the positive pressure source P. This offers the advantageous option of generating the ejector pulse as a function of the actual pressure established in the suction gripper unit 2 after its connection to the positive pressure source P. This offers the possibility of generating the ejector pulse in a way which takes account of the marginal conditions of the use of the vacuum gripping device 1.

The adaptive generation of the ejector pulse, which is guided by the actual pressure prevailing in the suction gripper unit 2, can be implemented in practice using various technical methods. Three operating methods which are deemed to be particularly advantageous are explained below with reference to the diagrams of FIGS. 4 to 6.

Figure 3:
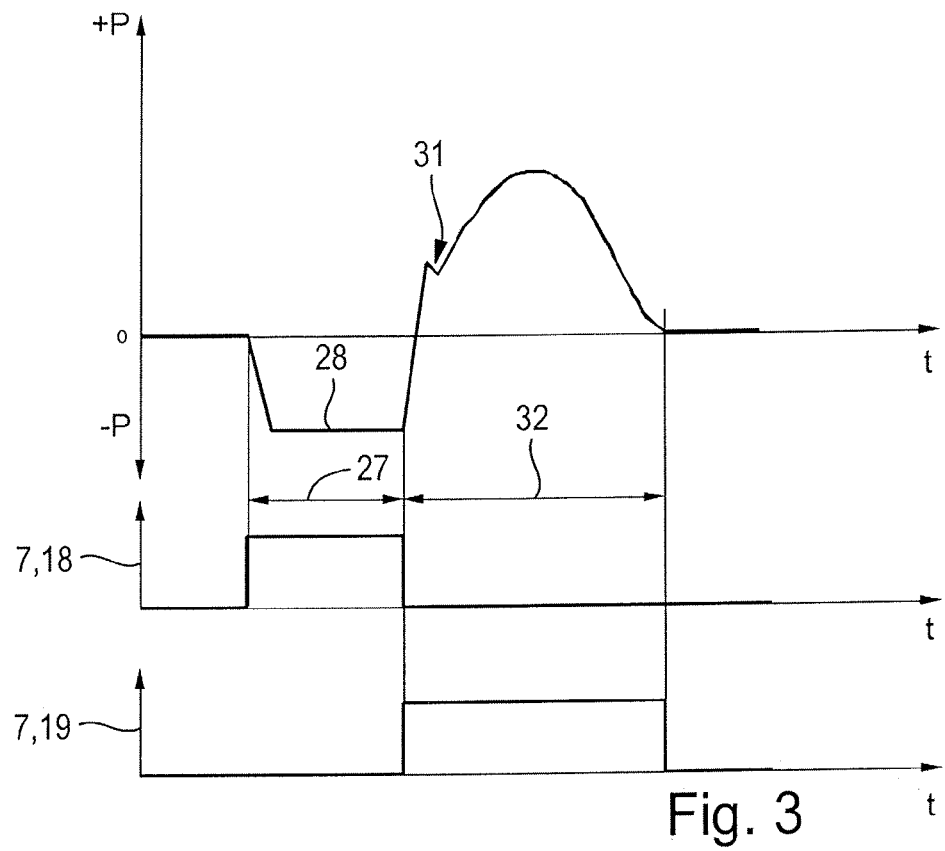
FIG. 3 is a diagram showing the basic pressure course of the actual pressure of the suction gripper unit when picking up and depositing an object.

To explain the specific advantages of the invention, the diagram of FIG. 3 shows the basic pressure course of the actual pressure when picking up and ejecting an object. Here and hereinafter, the term "actual pressure" denotes the pressure currently prevailing in the interior of the suction gripper unit 2 and detected by at least one of the pressure measurement devices 23.

All four diagrams of FIGS. 3 to 6 show the course of the actual pressure against the time "t" in the upper part. Positive pressures are identified as +P, negative pressures or vacuums as −P.

Figure 4:
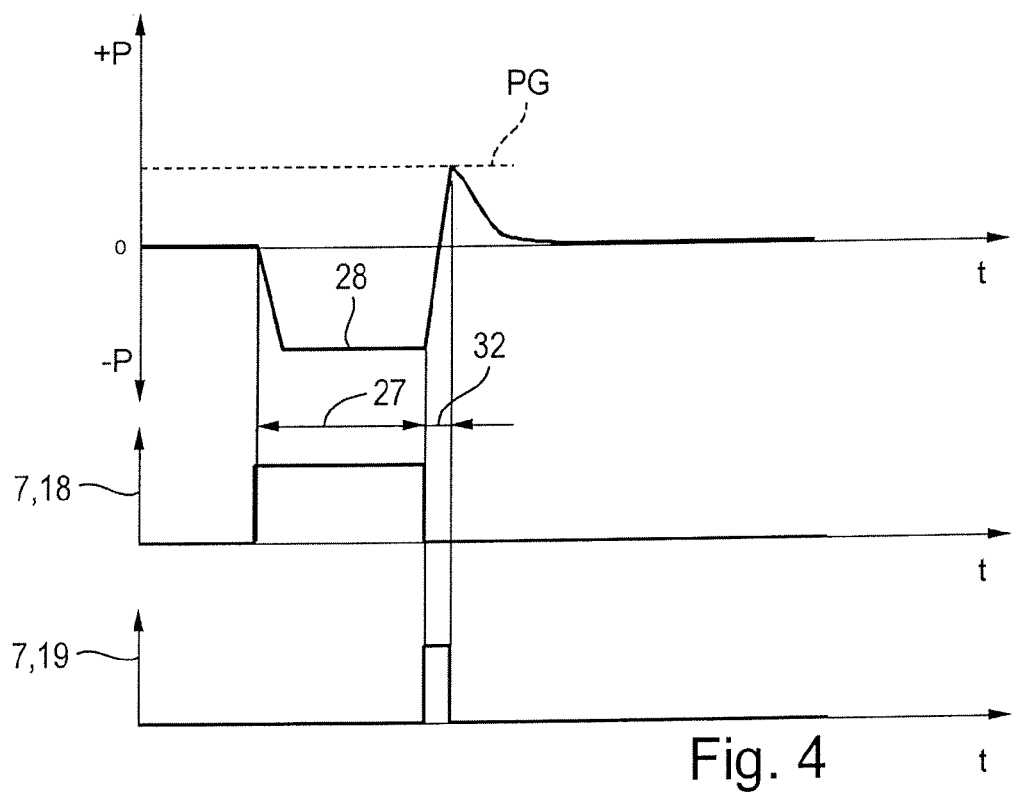
FIG. 4 is the diagram of a preferred first embodiment of the method according to the invention, which is based on the principle of pressure threshold detection.
Figure 6:
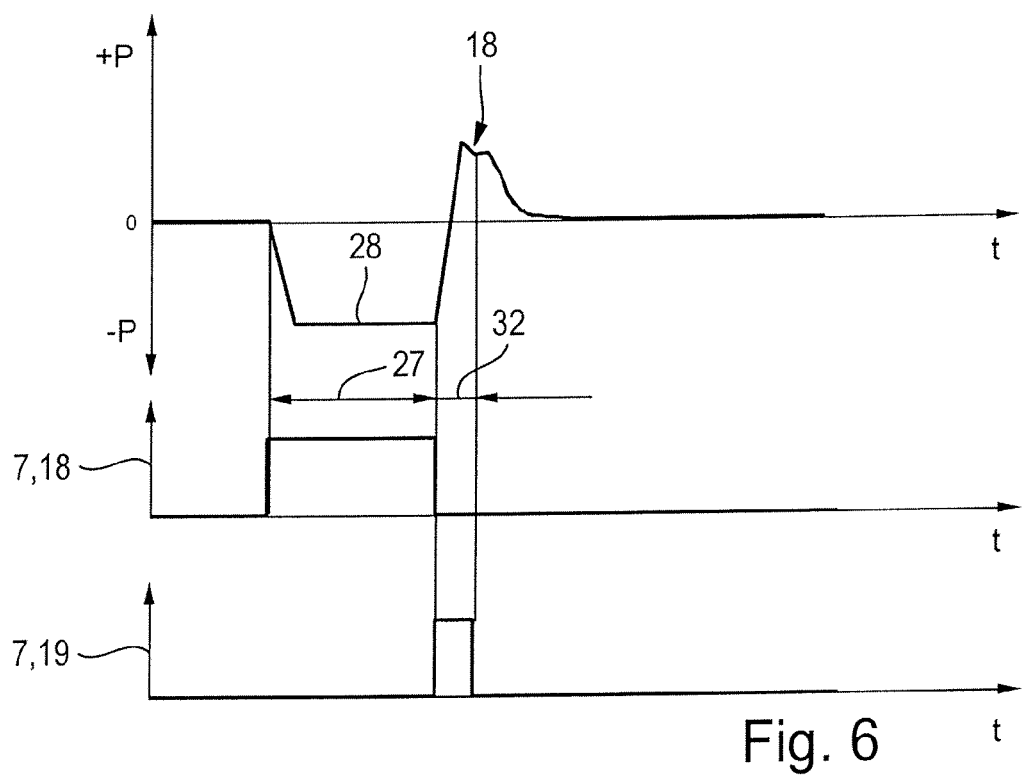
FIG. 6 is the diagram of a further advantageous embodiment of the method according to the invention, which is based on the principle of the ejection detection on the basis of detecting a pressure drop in the actual pressure course.

Below the pressure/time characteristic, all diagrams show characteristics related to the operating state of the control valve device 7. The methods illustrated in FIGS. 3, 4 and 6 are based on a vacuum gripping device 1 with a control valve device 7 comprising two digitally switchable control valves 18, 19 with a 2/2-way valve functionality, one controlling the vacuum supply and the other controlling the positive pressure supply, so that they will hereinafter also be described as vacuum control valve 18 and positive pressure control valve 19. In each of the diagrams, the switching state is plotted as a function of the operating time "t". The upper operating diagram in each case illustrates the operating state of the vacuum control valve 18, and the time-dependent operating state of the positive pressure control valve 19 is shown below. The operating sequences of the diagrams according to FIGS. 3, 4 and 6 can typically be implemented in the vacuum gripping device 1 of FIG. 2.

Figure 5:
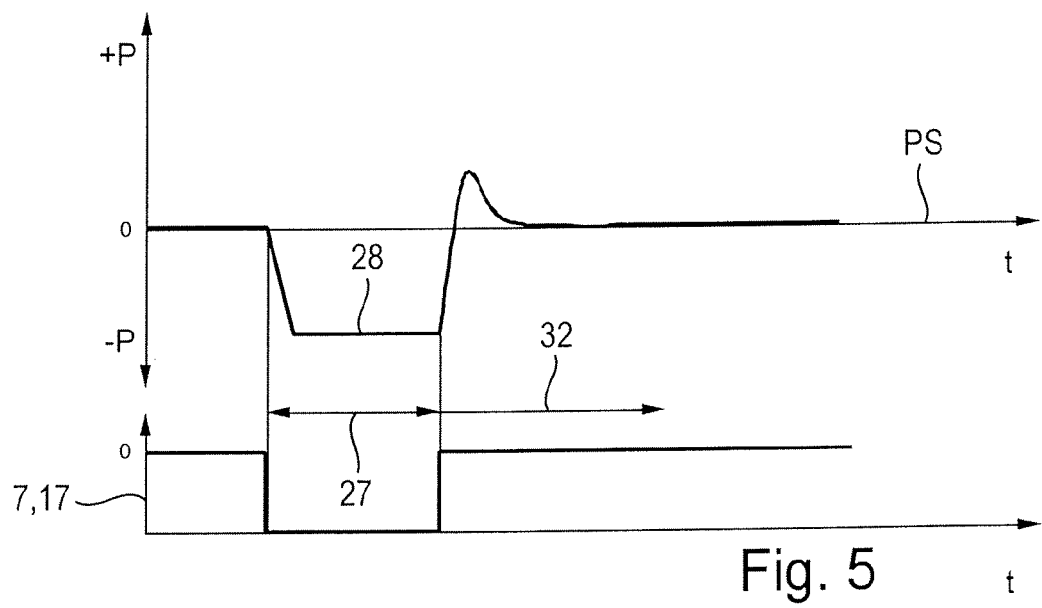
FIG. 5 is the diagram of a further embodiment of the method according to the invention, which is based on the principle of a pressure control of the actual pressure.

FIG. 5 illustrates an operating sequence of a vacuum gripping device 1 with a control valve device which is a proportional valve device 17 according to the model of FIG. 1. The associated valve operating diagram is shown below the pressure/time characteristic here as well.

According to FIG. 3, an operating cycle starts in the closed position of the two control valves 18, 19, so that the actual pressure is equal to zero, therefore corresponding to atmospheric pressure.

After the suction gripper 3 has been placed at the object 13 to be gripped, there follows a suction phase 27 resulting from the fact that the vacuum control valve 18 is open and the positive pressure control valve 19 is closed. As a result, the actual pressure drops below atmospheric pressure and a vacuum whereby the object 13 is gripped and held on the suction gripper 3 is formed in the suction gripper unit 2 including the suction gripper 3.

In the suction phase 27 and in particular while an actual pressure defining the maximum vacuum is maintained, the suction gripper 3 can be displaced for repositioning the held object 13. The characteristic section 28 illustrates the maximum negative pressure 28 of the actual pressure.

The suction phase 27 is followed by an ejection phase 32, in which the object 13 is thrown off the suction gripper 3 by the generation of the above-mentioned ejector pulse. This ejection phase 32 is characterised by the fact that the vacuum control valve 18 is switched into the closed position and the positive pressure control valve 19 is switched into the open position. The duration of the ejection phase 32 corresponds to the duration of the open position of the positive pressure control valve 19, which connects the positive pressure source P to the suction gripper unit 2.

During the ejection phase 32, the actual pressure initially increases and exceeds the threshold of atmospheric pressure. At the moment at which the object 13 is released by the suction gripper 3, the pressure course of the actual pressure registers a brief pressure drop 31. This is followed by a further pressure increase caused by the fact that the already ejected object continues to cover the opening of the suction gripper 3, thereby causing a flow resistance. If the object 13 is far enough away from the suction gripper 3, the actual pressure gradually drops to atmospheric pressure. Now the positive pressure control valve 19 can once again be closed.

In the operating methods shown in FIGS. 4 and 6, in accordance with the basic sequence of FIG. 3, the standstill phase, in which both the vacuum control valve 18 and the positive pressure control valve 19 are closed, is followed by the suction phase 27 with open vacuum control valve 18 and closed positive pressure control valve 19. In contrast to the conventional operating sequence of FIG. 3, however, the subsequent ejection phase 32, which is once again initiated by the closing of the vacuum control valve 18 and the opening of the positive pressure control valve 19, is considerably shorter.

In the operating method shown in FIG. 4, the reason for this is that the actual pressure in the suction gripper unit 2 is measured during the ejection phase 32 by means of at least one pressure measurement device 23 and the positive pressure source P is disconnected from the suction gripper unit 2 by suitable control of the switching valve device 22 when the measured actual pressure has reached a preset positive pressure limit value PG.

The electronic control unit 12 is expediently provided with storage means 33, in which the positive pressure limit value PG can be and/or is stored. Input means 34 assigned to the control unit 12 and only indicated diagrammatically expediently facilitate, if required, an input of the positive pressure limit value PG desired for the respective operating sequence; this is determined by the dimensions and/or the weight of the objects 13 to be gripped in particular. Comparator means which are part of the control means 26 continuously compare the measured actual value to the stored positive pressure limit value PG and cause the positive pressure control valve 19 to close as soon as the actual pressure has reached the preset positive pressure limit value PG. The vacuum control valve 18 remains closed. In this way, the ejector pulse is terminated abruptly. The fast disconnection of the positive pressure source P from the suction gripper unit 3 is facilitated by the use of a piezoelectric valve device 17.

As a result of the fact that the ejection phase 32 or the generation of the ejector pulse is only interrupted after the actual pressure has reached a positive pressure value, a safe ejection of the gripped object 13 is ensured. As positive pressure limit value PG, which can also be described as threshold value, a relative low positive pressure is expediently set or preset, so that an uncontrolled blow-off of the object 13 released by the suction gripper 3 and other adverse effects in the proximity of the suction gripper 3 are avoided. The optimum solution has been found in choosing a positive pressure limit value PG in the range of 0.05 bar to 0.15 bar, in particular in a range of about 0.1 bar.

While the operating method according to FIG. 4 is based on the fact that the ejector pulse is predetermined by a pressure threshold or a pressure limit, the method shown in FIG. 6 is based on the detection of the pressure drop 31 mentioned above when explaining the diagram of FIG. 3.

In the method according to FIG. 6, the actual pressure prevailing in the suction gripper unit 2 during the generation of the ejector pulse is again measured. The ejection phase 32 is, however, not terminated by a rigidly preset pressure limit value, but rather by the occurrence of the pressure drop 31 in the actual pressure course, which initially happens during the generation of the ejector pulse. As soon as this pressure drop 31 has been measured by at least one pressure measurement device 23, the electronic control unit 12 disconnects the positive pressure source P from the suction gripper unit 2, which in a specific case involves the closing of the positive pressure control valve 19, so that the suction gripper unit 2 is disconnected from both the positive pressure source P and the vacuum source V.

For the easy detection of the pressure drop 31, the control means 26 are expediently provided with differentiating means which electronically differentiate the detected pressure signal of the actual pressure and detect the pressure drop by finding a negative slope of the actual pressure course.

The electronic control unit 12 is preferably provided with at least one signal output means 35, where an ejection confirmation signal can be or is output as soon as the pressure drop 31 is detected. This ejection confirmation signal indicates unequi-vocally that the gripped object has been ejected. The ejection confirmation signal can be an optical signal and/or an electronic signal. The latter can advantageously be used in the control of the continued operating sequence of the vacuum gripping device 1.

In the operating method on which FIG. 5 is based, a gripping device 1 is used which—e.g. as exemplified in FIG. 1—comprises a control valve device 7 designed as a proportional valve device 17. The generation of the ejector pulse is here based on a control of the actual pressure during the ejection phase 32, which here likewise follows an upstream suction phase 27.

In FIG. 5, the target value of the control valve device 7 used as a control valve is plotted as a function of the time "t" below the pressure/time characteristic. During the suction phase 27, the flow cross-section between the suction gripper unit 2 and the vacuum source V is fully open to ensure as fast as possible a pressure drop and as fast as possible a gripping of the object 13. During the subsequent ejection phase 32, the actual pressure prevailing in the interior of the suction gripper unit 2 is once again continuously measured by means of a pressure measurement device 23 and adjusted to a preset target pressure by the regulated control of the control valve device 7. Input means 34 assigned to the control unit 12 preferably facilitate a variable input of the desired pressure value of the target pressure by the operator of the vacuum gripping device or by an external electronic control unit.

As target pressure, atmospheric pressure is preferably preset. In this way, the actual pressure during the ejection phase 32 is adjusted to a target pressure of 0 bar. The control means 26 fitted with suitable regulating means are parameterised in such a way that a targeted and controlled overshooting into the positive pressure range is caused in the pressure course of the actual pressure. This ensures that the vacuum in the suction gripper unit 2 has been relieved completely and the object which has been gripped up to now has been released from the suction gripper 3. In principle, the actual pressure during the ejection phase 32 could be adjusted to a target pressure which is slightly higher than atmospheric pressure. However, adjustment to atmospheric pressure is considerably more advantageous, in particular in terms of energy efficiency.

In the operation of the vacuum gripping device, the actual pressure can be measured by the at least one pressure measurement device 23 not only during the ejector pulse, but preferably during other operating phases as well, in particular during the suction phase 27. In this way, it is always ensured that the vacuum applied to the suction gripper unit 2 is strong enough for securely holding an object 13.

The at least one pressure measurement device 23 can, if required, also be used for a pressure control during the suction phase 27 and to hold the actual pressure at a sufficiently high level irrespective of a temporary interruption of the vacuum supply. This allows the temporary cessation of the negative pressure mode in order to save energy.

The invention claimed is:

1. A method for operating a vacuum gripping device comprising a suction gripper unit, which is provided with at least one suction gripper and which can be connected, via a control valve device connected to the suction gripper unit, selectively to a vacuum source causing a negative pressure in the suction gripper or to a positive pressure source generating an ejector pulse in the suction gripper,
   wherein the ejector pulse is generated as a function of the actual pressure established in the suction gripper unit after its connection to the positive pressure source, and
   wherein, during the generation of the ejector pulse, an actual pressure prevailing in the suction gripper unit is measured and the positive pressure source is disconnected from the suction gripper unit by means of the control valve device when a pressure drop is detected during the measurement of the actual pressure.

2. The method according to claim 1, wherein an actual pressure prevailing in the suction gripper unit is measured during the generation of the ejector pulse and the positive pressure source is disconnected from the suction gripper unit by means of the control valve device when the measured actual pressure has reached a preset positive pressure limit value.

3. The method according to claim 2, wherein a pressure of 0.05 bar to 0.15 bar is chosen as a positive pressure limit value.

4. The method according to claim 1, wherein, during the generation of the ejector pulse, an actual pressure prevailing in the suction gripper unit is measured, and this actual pressure is regulated to provide a target pressure by suitable control of the control valve device accompanied by an at least short-time overshooting of atmospheric pressure.

5. The method according to claim 4, wherein atmospheric pressure is preset as target pressure and the pressure control is parameterised in such a way that an overshooting into a positive pressure occurs in the pressure course of the actual pressure during the control process.

6. The method according to claim 1, wherein the pressure drop is detected by determining a negative gradient of the actual pressure course within a differentiation of the measured actual pressure course.

7. The method according to claim 1, wherein an ejection confirmation signal is generated on the basis of the detection of the pressure drop.

8. The method according to claim 1, wherein the suction gripper unit comprises a working line connected to the at least one suction gripper and to the control valve device, which working line is formed by a flexible hose line.

9. The method according to claim 8, wherein the actual pressure is measured in the region of the suction gripper in the transitional region between the working line and the suction gripper.

10. The method according to claim 8, wherein the actual pressure is measured in the region of the control valve device in the transitional region between the control valve device and the working line.

11. The method according to claim 1, wherein a piezoelectric valve device, is used as a control valve device.

12. The method according to claim 1, wherein a digitally switchable switching valve device, which expediently comprises individual control valves for the control of the connection to the positive pressure source and for the control of the connection to the vacuum source, is used as a control valve device.

13. A vacuum gripping device comprising a suction gripper unit, which is provided with at least one suction gripper and which can be connected, via a control valve device connected to the suction gripper unit, selectively to a vacuum source causing a negative pressure in the suction gripper or to a positive pressure source generating an ejector pulse in the suction gripper, wherein an electronic control unit is provided for controlling the control valve device, and wherein at least one pressure measurement device suitable for measuring the actual pressure prevailing in the suction gripper unit and communicating with the electronic control unit is assigned to the suction gripper unit,
   wherein the electronic control unit is provided with control means, by means of which the control valve device can be controlled for generating the ejector pulse as a function of the actual pressure established in the suction gripper unit after its connection to the positive pressure source, and
   wherein, during the generation of the ejector pulse, an actual pressure prevailing in the suction gripper unit is measured and the positive pressure source is disconnected from the suction gripper unit by means of the control valve device when a pressure drop is detected during the measurement of the actual pressure.

14. The vacuum gripping device according to claim 13, wherein the device it is designed to execute the method according to claim 1.

15. A method for operating a vacuum gripping device comprising a suction gripper unit, which is provided with at least one suction gripper and which can be connected, via a control valve device connected to the suction gripper unit, selectively to a vacuum source causing a negative pressure in the suction gripper or to a positive pressure source generating an ejector pulse in the suction gripper,
   wherein the ejector pulse is generated as a function of the actual pressure established in the suction gripper unit after its connection to the positive pressure source, and
   wherein, during the generation of the ejector pulse, an actual pressure prevailing in the suction gripper unit is measured, and this actual pressure is regulated to provide a target pressure by suitable control of the control valve device accompanied by an at least short-time overshooting of atmospheric pressure.

16. A vacuum gripping device comprising a suction gripper unit, which is provided with at least one suction gripper and which can be connected, via a control valve device connected to the suction gripper unit, selectively to a vacuum source causing a negative pressure in the suction gripper or to a positive pressure source generating an ejector pulse in the suction gripper, wherein an electronic control unit is provided for controlling the control valve device, and wherein at least one pressure measurement device suitable for measuring the actual pressure prevailing in the suction gripper unit and communicating with the electronic control unit is assigned to the suction gripper unit, and
   wherein the electronic control unit is provided with control means, by means of which the control valve device can be controlled for generating the ejector pulse as a function of the actual pressure established in the suction gripper unit after its connection to the positive pressure source, and
   wherein, during the generation of the ejector pulse, an actual pressure prevailing in the suction gripper unit is measured, and this actual pressure is regulated to provide a target pressure by suitable control of the control valve device accompanied by an at least short-time overshooting of atmospheric pressure.

\* \* \* \* \*